United States Patent
Ellis-Monaghan et al.

(10) Patent No.: US 9,310,576 B1
(45) Date of Patent: Apr. 12, 2016

(54) INTEGRATED CIRCUIT HAVING REDUNDANT OPTICAL SIGNAL PATHS AND METHOD OF CREATING SAME

(71) Applicant: International Business Machines Corporation, Armonk, NY (US)

(72) Inventors: John J. Ellis-Monaghan, Grand Isle, VT (US); Brendan S. Harris, Burlington, VT (US); Vibhor Jain, Essex Junction, VT (US); Thomas Kessler, Milpitas, CA (US); Yves T. Ngu, Essex, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/554,678

(22) Filed: Nov. 26, 2014

(51) Int. Cl.
*G02B 6/12* (2006.01)
*G02B 6/42* (2006.01)
*G02B 6/43* (2006.01)
*H01L 31/0232* (2014.01)

(52) U.S. Cl.
CPC ............ *G02B 6/4295* (2013.01); *G02B 6/4274* (2013.01); *G02B 6/43* (2013.01); *H01L 31/02327* (2013.01)

(58) Field of Classification Search
CPC ............... G02B 6/4295; G02B 6/4274; H01L 31/02327
See application file for complete search history.

(56) References Cited

U.S. PATENT DOCUMENTS

| 4,659,920 | A | 4/1987 | Nishiura et al. |
| 5,962,846 | A | 10/1999 | Goossen |
| 6,593,562 | B1 | 7/2003 | Parrish et al. |
| 6,897,498 | B2 * | 5/2005 | Gothoskar ............. B82Y 20/00 257/226 |
| 7,129,457 | B2 | 10/2006 | McElroy et al. |
| 7,297,915 | B2 | 11/2007 | McElroy et al. |
| 7,831,151 | B2 | 11/2010 | Trezza |
| 8,175,432 | B2 * | 5/2012 | Oikawa ............. G02B 6/12007 385/45 |
| 8,395,121 | B2 | 3/2013 | Chiba |
| 2010/0013042 | A1 | 1/2010 | Kim |
| 2013/0306928 | A1 * | 11/2013 | Cheng ..................... H01L 31/18 257/4 |

FOREIGN PATENT DOCUMENTS

| EP | 0527425 A1 | 2/1993 |
| EP | 1265451 A2 | 12/2002 |
| EP | 1267588 A2 | 12/2002 |

* cited by examiner

*Primary Examiner* — Omar R Rojas
(74) *Attorney, Agent, or Firm* — Steven J. Meyers; Hoffman Warnick LLC

(57) ABSTRACT

Various embodiments include an integrated circuit having: at least one waveguide disposed in a low refractive index layer; a splitter connected to the at least one waveguide, the splitter consisting of at least two signal paths; an optical signal detector connected to an end of each of the at least two signal paths; and an electrical disconnect member connected to each optical signal detector.

19 Claims, 4 Drawing Sheets

INTEGRATED CIRCUIT HAVING REDUNDANT OPTICAL SIGNAL PATHS AND METHOD OF CREATING SAME

BACKGROUND

The subject matter herein relates to silicon photonics. More particularly, the subject matter relates to redundancy in optical paths of silicon photonics.

As computer technology advances, the need for faster data transfer has increased. Integrated circuit (IC chip) manufacturers have turned to silicon photonics to satisfy this need. The use of silicon photonics allows the transfer of data in the form of optical pulses. These pulses travel within an individual chip, and between chips, via silicon waveguides. However, before the data carried as optical signals can be reconverted into electrical form, the light must be detected. Accordingly, semiconductor detectors have been integrated into the waveguides to detect the optical pulses.

Conventionally, these integrated circuits are single waveguide systems. Therefore, a single optical detector is placed at the end of the waveguide to detect the optical signal. Optical detectors may include, but are not limited to, germanium detectors, graphene detectors, and silicon detectors. Each type of detector has its own yield problems. Germanium detectors, for example, can have a single detector yield as low as 70%. That is, a germanium detector may have a 30% probability of malfunctioning. Since conventional integrated circuits are single detector systems, a malfunctioning detector will prevent the whole integrated circuit system from functioning properly.

A malfunction within a detector may occur in a variety of ways. For example, a detector may have a short in its system. A functional detector may have a silicon waveguide, a detector, and metal contacts. A malfunctioning detector may have a bridge between the metal contacts resulting in a short in the system. Such an occurrence can exhibit very high dark current between the metal contacts and therefore cause damage to the circuit. A detector may also fail due to opens in the system or due to faulty manufacturing.

SUMMARY

Various embodiments provide a structure using a splitter at an end of a waveguide to create redundant optical paths, and an electrical disconnect member at an output of an optical signal detector to isolate a malfunctioning optical signal detector.

A first aspect includes an integrated circuit having at least one waveguide disposed in a low refractive index layer; a splitter connected to each of the at least one waveguides, the splitter including at least two signal paths; an optical signal detector connected to an end of each of the at least two signal paths; and an electrical disconnect member connected to each optical signal detector.

A second aspect includes a system to create redundancy in optical paths of silicon photonics having at least one chip; at least one waveguide disposed in a low refractive index layer of the at least one chip; an optical splitter including at least two optical paths, the optical splitter connected to each of the at least one waveguides; a germanium detector for detecting optical signals, the germanium detector connected to an end of each of the at least two optical paths; and an electrical disconnect member connected to each germanium detector.

A third aspect includes a method for creating redundancy in optical paths of an integrated circuit comprising, forming a waveguide in a low refractive index layer of an integrated circuit, the waveguide having an optical signal therein; forming a splitter at an end of the waveguide, the splitter having at least a first signal path and a second signal path; forming a first optical signal detector at an end of the first signal path; forming a second optical signal detector at an end of the second signal path; forming a first electrical disconnect member connected to the first optical signal detector; and forming a second electrical disconnect member connected to the second optical signal detector, such that the integrated circuit does not fail upon the first optical signal detector malfunctioning.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
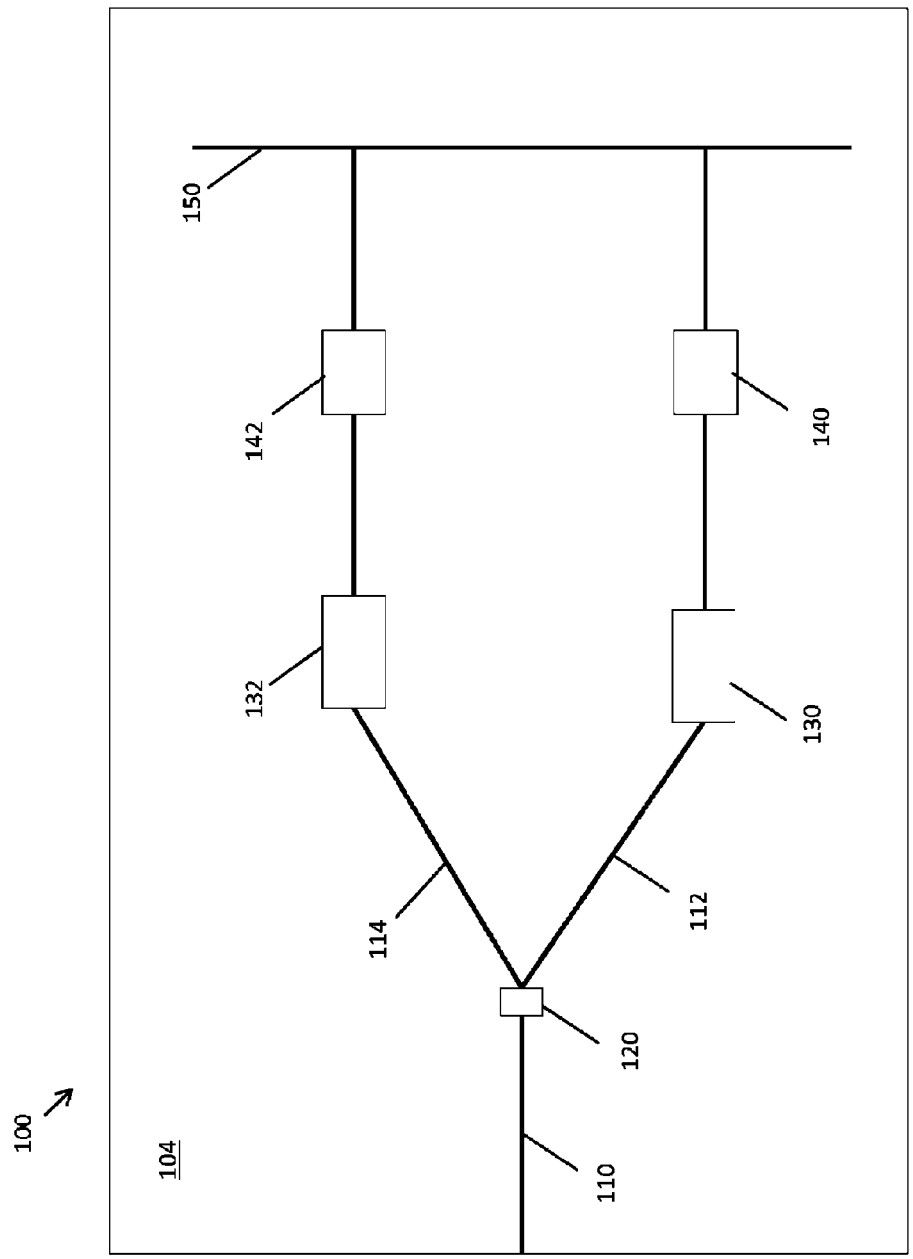
FIG. 1 shows a schematic of an embodiment of the invention including a splitter having at least two signal paths.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, subject matter disclosed herein relates to silicon photonics. More particularly, the subject matter relates to redundancy in optical paths of silicon photonics.

As described further herein, the integrated circuit creates redundant signal paths by having a splitter at an end of a waveguide, and isolates a malfunctioning optical signal detector from the integrated circuit by having an electrical disconnect member at an output of an optical signal detector. Conventional circuit systems, utilizing only a single waveguide and a single detector, may result in a failed integrated circuit when the single detector malfunctions.

The integrated circuit herein uses a splitter having at least two signal paths to split an optical signal carried by a waveguide. At the end of each signal path, an optical signal detector is connected such that there are at least two detectors. Each optical signal detector is connected to an electrical disconnect member such that, if one of the detectors malfunctions, the electrical disconnect member connected to the malfunctioning detector will disconnect the malfunctioning detector from the integrated circuit, and therefore maintain the overall functionality of the integrated circuit.

Generally, the overall yield of a single detector integrated circuit depends on the yield of the single detector. Embodiments of the present invention increase the overall yield of the integrated circuit by providing redundant signal paths such that the yield of the overall circuit depends not on the yield of a single detector, but rather on the number of working detectors out of the total number of detectors within the circuit.

FIG. 1 shows an integrated circuit 100 of embodiments of the present invention. Integrated circuit 100 may be an integrated optical and electric circuit, i.e. an integrated photonic and electronic circuit. Integrated circuit 100 includes a low refractive index layer 104, at least one waveguide 110, a splitter 120, optical signal detectors 130, 132, and electrical disconnect members 140, 142. Low refractive index layer 104 may be disposed on a substrate (not shown) of integrated circuit 100 as is generally known in the art of semiconductor/integrated circuit manufacturing.

Substrate materials of the substrate may include but are not limited to: silicon, germanium, silicon germanium, silicon carbide, and those consisting essentially of one or more III-V compound semiconductors having a composition defined by the formula $Al_{X1}Ga_{X2}In_{X3}AS_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

Low refractive index layer 104 may include any material having an optical refractive index lower than that of waveguide 110, as will be described further below. In one embodiment, low refractive index layer 104 may have a refractive index of approximately 2.0 or less. It is to be understood that refractive index as used herein describes a ratio of the speed of light in a vacuum to the speed of light in the medium in question. Low refractive index layer 104 may include a multiplicity of layers. In one embodiment, low refractive index layer 104 includes a dielectric layer. Dielectric layer materials may include but are not limited to: silicon nitride (Si3N4), silicon oxide (SiO2), fluorinated SiO2 (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or multiple layers thereof. Low refractive index layer 104 may also include air. Low refractive index layer 104 may be formed on substrate of integrated circuit 100 as is generally known in the art of semiconductor/integrated circuit manufacturing. For example, low refractive index layer 104 may be formed on substrate using any now known of later developed deposition technique such as, for example, chemical vapor deposition (CVD), low-pressure CVD (LPCVD), plasma-enhanced CVD (PECVD), semi-atmosphere CVD (SACVD), high density plasma CVD (HDPCVD), atomic layer deposition (ALD), etc.

Waveguide 110 may be formed in low refractive index layer 104 by conventional photolithography and etch processes, well known in the art of semiconductor/integrated circuit manufacturing, such that waveguide 110 is surrounded by low refractive index layer 104. Waveguide 110 may be formed of a semiconductor or dielectric material, as previously discussed, with an optical refractive index higher than the surrounding low refractive index layer 104. In one embodiment, silicon (which is transparent to infra-red light) is used for waveguide 110. Silicon may be arranged with a cross section of dimensions of about 0.15 um height by about 0.3 um width. However, as one skilled in the art would understand, these dimensions may change based on the wavelength of light for a given application. Silicon has a refractive index of about 3.4. In this embodiment, the low refractive index 104 which surrounds waveguide 110 may be a combination of silicon nitrides and silicon dioxide as is typically done in integrated circuit manufacturing. Silicon nitride typically has a refractive index of about 2.0 and silicon dioxide has a refractive index of 1.5. Waveguide 110 may carry an optical signal (not shown) therein.

Splitter 120 may be connected to waveguide 110. Splitter 120 may include any device or structure capable of dividing an optical signal as it passes from waveguide 110 to splitter 120, such as, for example, a multimode splitter or a 50% directional coupler. Splitter 120 may comprise at least two signal paths. FIG. 1 shows splitter 120 comprising a first signal path 112 and a second signal path 114. Splitter 120 may be connected to waveguide 110 such that the optical signal carried by waveguide 110 is split into as many signal paths that splitter 120 comprises. For example, first signal path 112 and second signal path 114 of FIG. 1 can each carry approximately 50% of the optical signal initially carried by waveguide 110. That is, the optical signal can be split such that one signal path carries as low as 30% of the optical signal from waveguide 110, while the other signal path may carry as high as 70% of the optical signal from the waveguide 110 without departing from embodiments of the invention. It is to be understood that splitter 120 may comprise any number of signal paths without departing from embodiments of the invention and the optical signal can be split amongst the number of signal paths. It is also to be understood that the signal paths referred to herein may include waveguides or optical fibers.

The at least two signal paths 112, 114 may each be connected to an optical signal detector 130, 132 such that the signal carried by signal paths 112, 114 travels through the corresponding optical signal detector 130, 132 for each signal path 112, 114. As shown in FIG. 1, first signal path 112 may be connected at an end to first optical signal detector 130. Second signal path 114 may be connected at an end to second optical signal detector 132. Optical signal detectors 130, 132 detect optical signals so that the data carried by the optical signal can be converted to an electrical signal. Optical signal detectors 130, 132 may include, but are not limited to, germanium (Ge) detectors, graphene detectors, or silicon (Si) detectors, mercury cadmium telluride (HgCdTe) detectors, indium gallium arsenide (InGaAs) detectors, lead sulfide (PbS) detectors, indium phosphide (InP) detectors, and gallium nitride (GaN) detectors. In one embodiment, optical signal detectors 130, 132 may be connected to signal paths 112, 114 such that first optical signal detector 130 is in parallel with second optical signal detector 132. It is to be understood that the integrated circuit described herein may be used with any semiconductor detector without departing from embodiments of the invention.

In accordance with embodiments of the invention, optical signal detectors 130, 132 may also each be connected to electrical disconnect members 140, 142. As shown in FIG. 1, first optical signal detector 130 may be connected to first electrical disconnect member 140, and second optical signal detector 132 may be connected to second electrical disconnect member 142 such that electrical disconnect members 140, 142 are functionally responsive to their respective optical signal detector 130, 132 malfunctioning. As will be described, electrical disconnect members 140, 142 can be used to isolate a malfunctioning optical signal detector. Electrical disconnect members 140, 142 may be set by physical action or electrical input to isolate a malfunctioning detector. Electrical disconnect members 140, 142 may sense a malfunctioning detector or, for example, the presence of a dark current that is a source of noise, and automatically disconnect a malfunctioning detector. Alternatively, the optical signal detectors 130, 132 may be periodically tested to determine whether one of the optical signal detectors 130, 132 has malfunctioned. In this embodiment, electrical disconnect members 140, 142 may be triggered to disconnect the malfunctioning detector. In one embodiment, electrical disconnect members 140, 142 may include a fuse that may be designed to blow when connected to a malfunctioning detector. That is, the fuse may be programmed to physically disconnect a malfunctioning optical signal detector from the integrated circuit. For example, electrical disconnect members 140, 142 may include polycrystalline fuses, metal silicide fuses, metal fuses, or anti-fuses. In another embodiment, electrical disconnect members 140, 142 may include a programmable logic device to electrically disconnect a malfunctioning detector. In this embodiment, electrical disconnect members 140, 142 may include pass-gate or other types of complementary metal oxide semiconductor (CMOS) logic. In either embodiment, optical signals may be combined and converted into electrical signal 150 after passing through the detectors 130, 132 and electrical disconnect members 140, 142.

Figure 2:
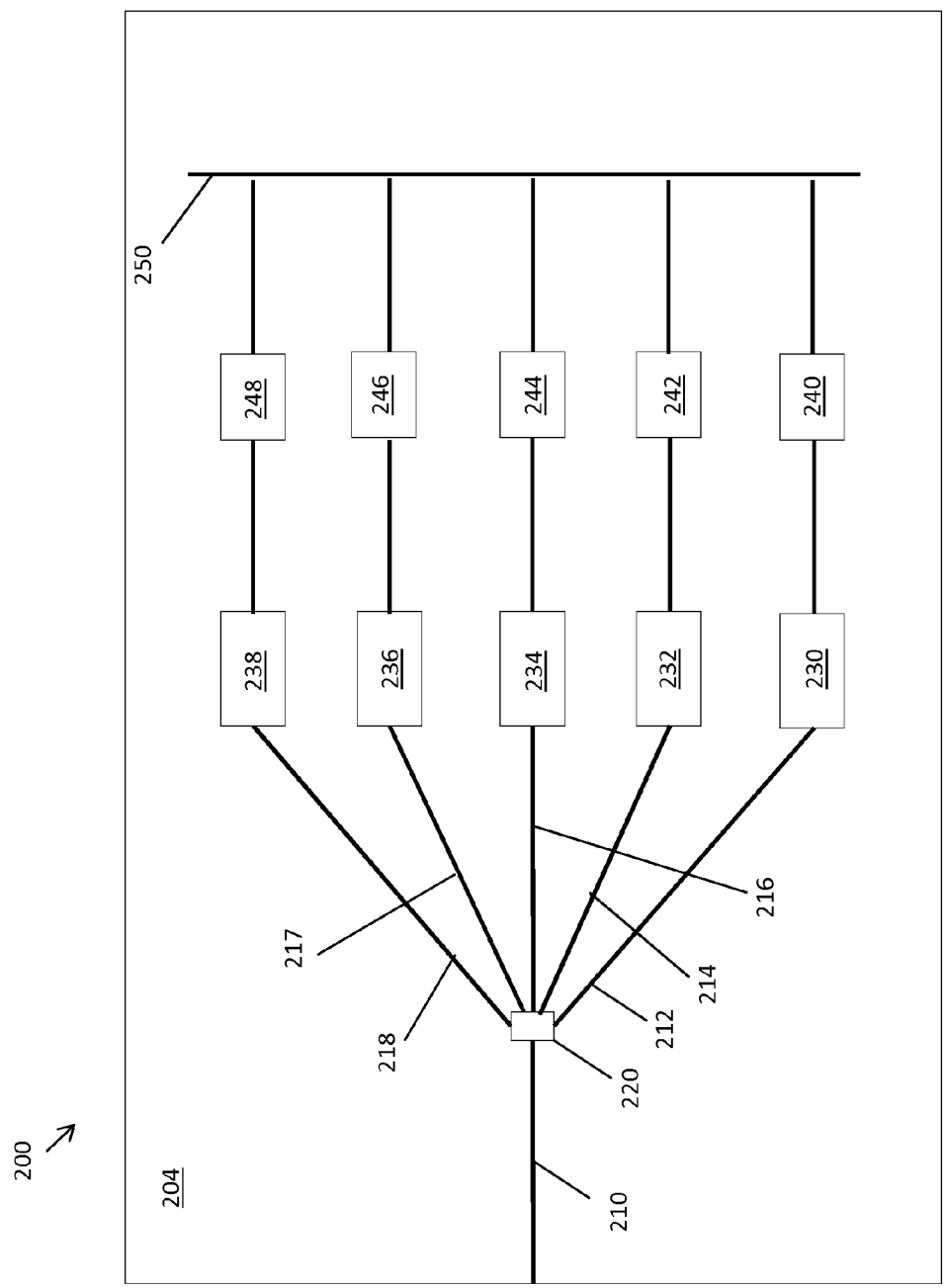
FIG. 2 shows a schematic of an embodiment of the invention including a splitter having five signal paths.

Referring now to FIG. 2, which shows another embodiment of the invention comprising at least one waveguide 210 disposed within a low refractive index layer 204 of an integrated circuit 200, a splitter 220, optical signal detectors 230-238, and electrical disconnect members 240-248. As discussed previously, low refractive index layer 204 may be disposed on a substrate (not shown) of integrated circuit 200 as is generally known in the art of semiconductor/integrated circuit manufacturing. As shown in FIG. 2, splitter 220 may be connected to waveguide 210 wherein splitter 220 has a first optical signal path 212, a second optical signal path 214, a third optical signal path 216, a fourth optical signal path 217, and a fifth optical signal path 218. Each optical signal path 212-218 may be connected to an optical signal detector 230-238. As discussed above, optical signal detectors 230-238 may include but are not limited to, germanium (Ge) detectors, graphene detectors, or silicon (Si) detectors, mercury cadmium telluride (HgCdTe) detectors, indium gallium arsenide (InGaAs) detectors, lead sulfide (PbS) detectors, indium phosphide (InP) detectors, and gallium nitride (GaN) detectors. In one embodiment, optical signal detectors 230-238 may be connected to signal paths 212-218 such that they are in parallel with one another. Each optical signal detector 230-238 may be connected to an electrical disconnect member 240-248. As discussed above, electrical disconnect members 240-248 may include a fuse or programmable logic device wherein the fuse may be programmed to physically disconnect a malfunctioning detector and the programmable logic device may electrically disconnect a malfunctioning detector. After passing through detectors 230-238 and electrical disconnect members 240-248, optical signals may be combined and converted into electrical signal 250. It is to be understood that all embodiments or alternatives discussed elsewhere herein also apply to this embodiment.

Figure 3:
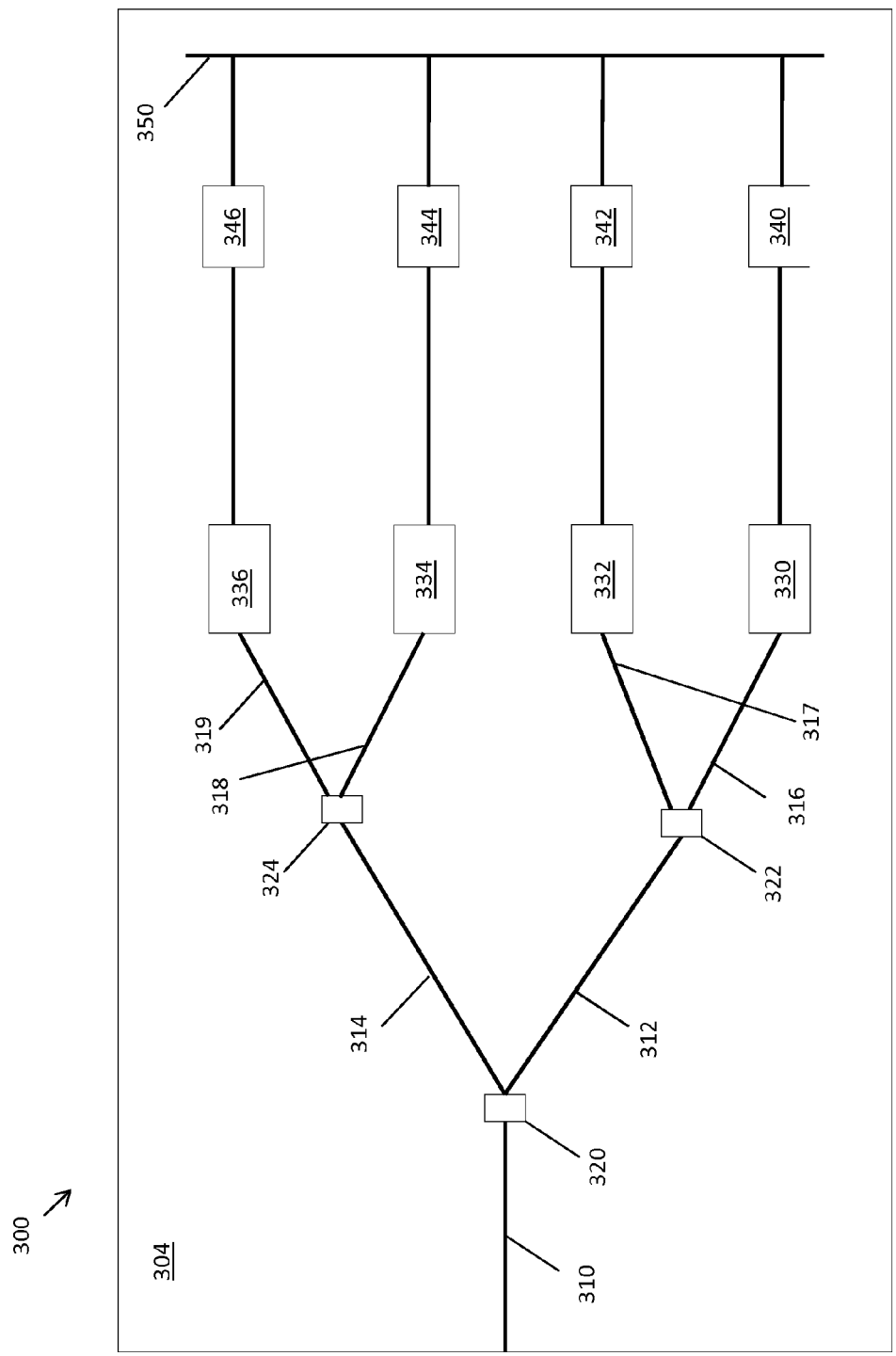
FIG. 3 shows a schematic of an embodiment of the invention including a first splitter, a second splitter, and a third splitter.

Referring now to FIG. 3, which shows another embodiment of the invention wherein there is a plurality of splitters connected to waveguide 310 in low refractive index layer 304. It is to be understood that in this embodiment, the plurality of splitters can include any number of splitters having at least two signal paths without departing from embodiments of the invention as described herein. However, FIG. 3 shows one example of this embodiment wherein waveguide 310 is connected to a first splitter 320 having a first signal path 312 and a second signal path 314. First signal path 312 of first splitter 320 may be connected to a second splitter 322. Second splitter 322 may have a first signal path 316 and a second signal path 317. First signal path 316 of second splitter 322 may be connected to a first optical signal detector 330. Second signal path 317 of second splitter 322 may be connected to a second optical signal detector 332. First optical signal detector 330 may be connected to a first electrical disconnect member 340. Second optical signal detector 332 may be connected to a second electrical disconnect member 342.

Second signal path 314 of first splitter 320 may be connected to third splitter 324. Third splitter 324 may have a first signal path 318 and a second signal path 319. First signal path 318 of third splitter 324 may be connected to a third optical signal detector 334. Second signal path 319 of third splitter 324 may be connected to a fourth optical signal detector 336. Third optical signal detector 334 may be connected to a third electrical disconnect member 344. Fourth optical signal detector 336 may be connected to a fourth electrical disconnect member 346.

As discussed herein, optical signal detectors 330-336 may include germanium (Ge) detectors, graphene detectors, or silicon (Si) detectors, mercury cadmium telluride (HgCdTe) detectors, indium gallium arsenide (InGaAs) detectors, lead sulfide (PbS) detectors, indium phosphide (InP) detectors, and gallium nitride (GaN) detectors. Optical signal detectors 330-336 may be connected to signal paths 316-319 such that they are in parallel with one another. Additionally, electrical disconnect members 340-346 may include a fuse or programmable logic device wherein the fuse may be programmed to physically disconnect a malfunctioning detector and the programmable logic device may electrically disconnect a malfunctioning detector. After passing through optical signal detectors 330-336 and electrical disconnect members 340-346, optical signals may be combined and converted into electrical signal 350. It is to be understood that all embodiments or alternatives discussed elsewhere herein also apply to this embodiment.

In any of the embodiments discussed above, it is also to be understood that the number of detectors can be directly proportional to the number of signal paths that the at least one waveguide is split into. The number of signal paths may be determined by the desired overall yield of the integrated circuit. It is to be understood that yield as used herein refers to the likelihood that the device (i.e. the integrated circuit or individual signal detector) will function properly. Accordingly, the number of signal paths depends on the individual yield of each signal detector, the reduction of signal strength that the detectors can tolerate, and the amount by which power inputted into the integrated circuit can be increased.

For example, the expected yield of the integrated circuit can be represented by the following formula:

$$Yi_T = \sum_{x=x1}^{x=y} yi^x * (1 - yi)^{y-x} * \frac{y!}{x!(y-x)!}$$

wherein $Yi_T$ is the expected yield of the total circuit (%); yi is the yield of an individual detector; x is the number of working detectors; y is the number of total detectors; x1 is the minimum number of detectors that need to be functional defined by single detector yield and output power level that can still be detected.

As discussed above, the signal that is carried through the waveguide can be split into the number of signal paths outputted from the splitter. As the number of signal paths increases, the signal strength (power per unit area) that travels within each signal path decreases. Each detector has a minimum threshold of signal strength that it is able to detect, i.e. sensitivity. Therefore, an integrated circuit having detectors that have a higher sensitivity can include a larger number of signal paths and still function properly. However, an integrated circuit having detectors that have a low sensitivity may include fewer signal paths in order for the integrated circuit to function properly. For example, where a low yielding detector having high sensitivity, such as a germanium detector, is used as the optical signal detector, the number of signal paths that the integrated circuit can tolerate can be, e.g., about ten, or between two and five. Therefore, an integrated circuit using germanium detectors may have about ten detectors, or between two and five.

Implementing redundancy requires the use of detectors that have enough sensitivity that enable the integrated circuit to still work properly given the available power of the remaining working detectors. When power is low, detectors having a high sensitivity may be used. When power is high, or allowed to be increased based on power standards of the given application, detectors having a low sensitivity may be used. An integrated circuit wherein each individual detector has a lower yield and a higher sensitivity, allows for more detectors in the circuit to maintain the overall yield of the circuit. An integrated circuit wherein each individual detector has a higher yield and a lower sensitivity, allows for fewer detectors in the circuit to maintain the overall yield of the circuit.

Where an individual detector malfunctions within the integrated circuit, the remaining working detectors allow the circuit to work at x/y*100% of the power, wherein x is the number of working detectors and y is the number of total detectors, as discussed herein. That is, if the circuit comprises four signal paths, and therefore four detectors, with one detector malfunctioning, the integrated circuit only works at 75% power. The 75% power that remains within the circuit is converted to an electrical signal.

Figure 4:
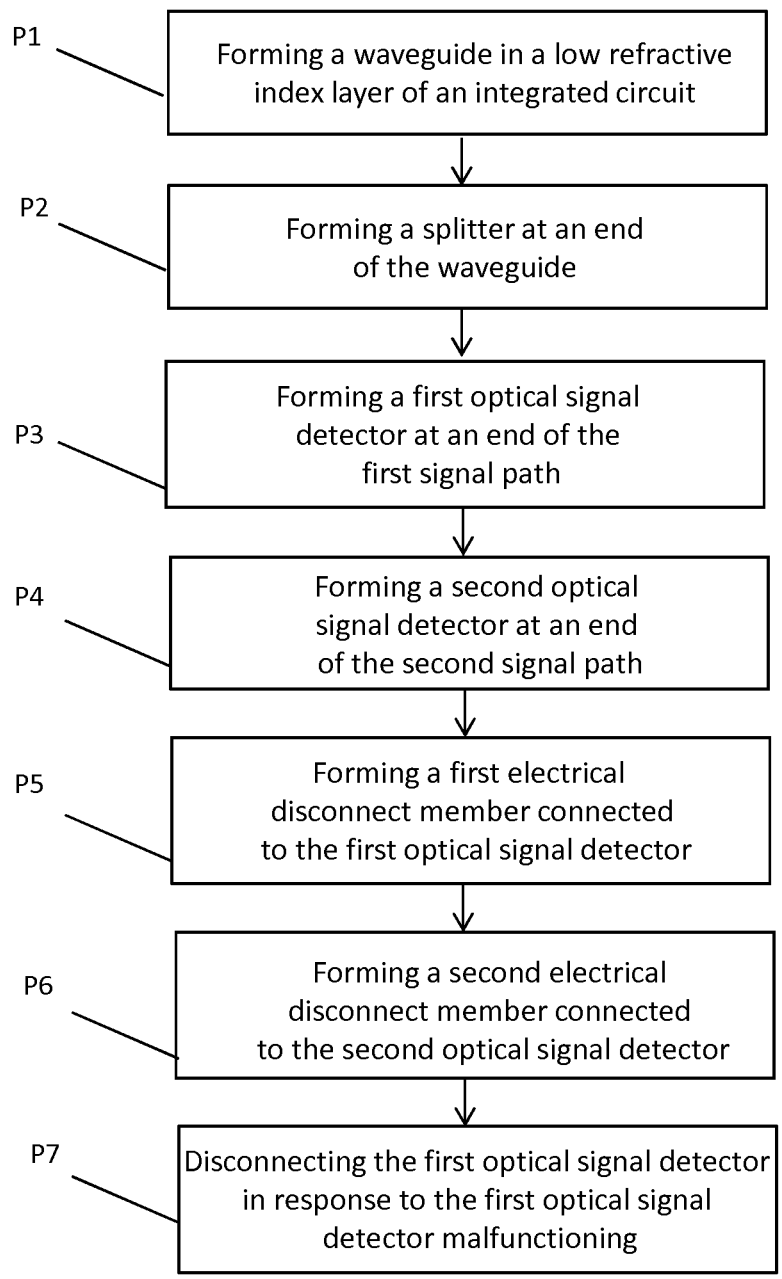
FIG. 4 shows a flow diagram of a method for creating redundancy in optical paths of an integrated circuit.

Turning now to FIG. 4, an illustrative method flow diagram is shown according to embodiments of the invention. In process P1, waveguide is formed in low refractive index layer of an integrated circuit via conventional semiconductor processes (deposition, etching, etc.) as discussed herein relative to FIG. 1, such that low refractive index layer surrounds waveguide. Waveguide is formed of a material having a higher refractive index than that of low refractive index layer, such as semiconductor or dielectric materials. The waveguide carries an optical signal during operation. In process P2, splitter is formed at an end of the waveguide, the splitter having at least two signal paths for splitting the optical signal between at least a first signal path and a second signal path. In process P3, first optical signal detector is formed at an end of the first signal path, such that the optical signal carried by first signal path passes through first optical signal detector. In process P4, second optical detector is formed at an end of the second signal path, such that the optical signal carried by second signal path passes through second optical signal detector. Second optical signal detector may be formed such that it is in parallel with first optical signal detector. In process P5, a first electrical disconnect member is formed such that it is connected to the first optical signal detector. In process P6, a second electrical disconnect member is formed such that it is connected to the second optical signal detector.

The method may further comprise, process P7, disconnecting the first optical signal detector from the integrated circuit in response to the first optical signal detector malfunctioning. As described herein, electrical disconnect members may include a fuse or a programmable logic device. Where the first electrical disconnect member includes a fuse programmed to disconnect in response to a malfunctioning optical signal detector, the disconnecting can include physically disconnecting the first optical signal detector from the integrated circuit. Where the first electrical disconnect member includes a programmable logic device, the disconnecting can include electrically disconnecting the first optical detector from the integrated circuit. As described above, disconnecting of a malfunctioning detector isolates the malfunctioning detector such that the integrated circuit system may still function.

The terminology used herein is for the purpose of describing particular embodiments only and is not intended to be limiting of the disclosure. As used herein, the terms "first," "second," and the like, do not denote any order, quantity, or importance, but rather are used to distinguish one element from another, and the terms "a" and "an" herein do not denote a limitation of quantity, but rather denote the presence of at least one of the referenced item. It will be further understood that the terms "comprises" and/or comprising," when used in this specification, specify the presence of stated features, integers, steps, operations, elements, and/or components, but do not preclude the presence or addition of one or more other features, integers, steps, operations, elements, components, and/or groups. The method steps, processes, and operations described herein are not to be construed as necessarily requiring their performance in the particular order discussed or illustrated, unless specifically identified as an order of performance. It is also to be understood that additional or alternative steps may be employed.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

We claim:

1. An integrated circuit comprising,
  at least one waveguide disposed in a low refractive index layer;
  a splitter connected to each of the at least one waveguides, the splitter including at least two signal paths;
  an optical signal detector connected to an end of each of the at least two signal paths; and
  an electrical disconnect member connected to each optical signal detector and configured to disconnect a corresponding optical signal detector in response to the corresponding optical signal detector malfunctioning.

2. The integrated circuit of claim 1, wherein the optical signal detector includes a germanium detector.

3. The integrated circuit of claim 1, wherein the low refractive index layer includes a dielectric layer.

4. The integrated circuit of claim 1, wherein the splitter includes two to five signal paths.

5. The integrated circuit of claim 1, wherein each optical signal detector is connected in parallel.

6. The integrated circuit of claim 1, wherein the electrical disconnect member includes a fuse selected from one of a polycrystalline fuse, a metal silicide fuse, a metal fuse, or an anti-fuse, and wherein the fuse is programmed to physically disconnect a malfunctioning optical signal detector from the integrated circuit.

7. The integrated circuit of claim 1, wherein the electrical disconnect member includes a programmable logic device, and wherein the programmable logic device electrically disconnects a malfunctioning optical signal detector from the integrated circuit.

8. The integrated circuit of claim 1, wherein the waveguide includes an optical signal therein, the optical signal being split between the at least two signal paths of the splitter.

9. The integrated circuit of claim 1, wherein the splitter includes a first splitter, a second splitter, and a third splitter,
wherein the first splitter comprises a first end and a second end, the first end of the first splitter being connected to the waveguide, the second end of the first splitter having a first signal path and second signal path,
wherein the second splitter comprises a first end and a second end, the first end of the second splitter being connected to the first signal path of the first splitter, the second end of the second splitter having at least two signal paths, and
wherein the third splitter comprises a first end and a second end, the first end of the third splitter being connected to the second signal path of the first splitter, the second end of the third splitter having at least two signal paths.

10. A system to create redundancy in optical paths of silicon photonics, the system comprising,
at least one chip;
at least one waveguide disposed in a low refractive index layer of the at least one chip;
an optical splitter including at least two optical paths, the optical splitter connected to each of the at least one waveguides;
a germanium detector for detecting optical signals, the germanium detector connected to an end of each of the at least two optical paths; and
an electrical disconnect member connected to each germanium detector and configured to disconnect a corresponding germanium detector in response to the corresponding germanium detector malfunctioning.

11. The system of claim 10, wherein the low refractive index layer includes a dielectric layer.

12. The system of claim 10, wherein the optical splitter includes two to five optical paths.

13. The system of claim 10, wherein the electrical disconnect member includes a fuse selected from one of a polycrystalline fuse, a metal silicide fuse, a metal fuse, or an anti-fuse, and wherein the fuse is programmed to physically disconnect a malfunctioning germanium detector from the chip.

14. The system of claim 10, wherein the electrical disconnect member includes a programmable logic device, the programmable logic device electrically disconnecting a malfunctioning germanium detector from the chip.

15. The system of claim 10, wherein the waveguide includes an optical signal therein, the optical signal being split between the at least two signal paths.

16. A method for creating redundancy in optical paths of an integrated circuit, the method comprising,
forming a waveguide in a low refractive index layer of an integrated circuit, the waveguide having an optical signal therein;
forming a splitter at an end of the waveguide, the splitter having at least a first signal path and a second signal path;
forming a first optical signal detector at an end of the first signal path;
forming a second optical signal detector at an end of the second signal path;
forming a first electrical disconnect member connected to the first optical signal detector;
forming a second electrical disconnect member connected to the second optical signal detector, such that the integrated circuit does not fail upon the first optical signal detector malfunctioning;
disconnecting the first optical signal detector from the integrated circuit in response to the first optical signal detector malfunctioning.

17. The method of claim 16, wherein the first electrical disconnect member includes a fuse programmed to physically disconnect the first optical signal detector in response to the first optical signal detector malfunctioning, the disconnecting further comprising physically disconnecting the first optical signal detector from the integrated circuit.

18. The method of claim 16, wherein the electrical disconnect member includes a programmable logic device, the disconnecting further comprising electrically disconnecting the first optical signal detector from the integrated circuit using the programmable logic device.

19. The method of claim 16, further comprising forming the second optical signal detector at the end of the second signal path such that the second optical signal detector is in parallel with the first optical signal detector.

* * * * *